United States Patent
Garcia et al.

(10) Patent No.: US 12,158,576 B2
(45) Date of Patent: Dec. 3, 2024

(54) COUNTERFLOW GAS NOZZLE FOR CONTAMINATION MITIGATION IN EXTREME ULTRAVIOLET INSPECTION SYSTEMS

(71) Applicant: KLA Corporation, Milpitas, CA (US)

(72) Inventors: Rudy F. Garcia, Union City, CA (US); Michael Lang, Pleasant Hill, CA (US); Ravichandra Jagannath, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 553 days.

(21) Appl. No.: 17/333,717

(22) Filed: May 28, 2021

(65) Prior Publication Data
US 2022/0382046 A1   Dec. 1, 2022

(51) Int. Cl.
  G02B 27/00    (2006.01)
  G03F 7/00     (2006.01)
  G21K 1/06     (2006.01)

(52) U.S. Cl.
  CPC ..... G02B 27/0006 (2013.01); G03F 7/70033 (2013.01); G03F 7/70916 (2013.01); G03F 7/70933 (2013.01); G21K 1/06 (2013.01)

(58) Field of Classification Search
  CPC ............. G03F 7/70033; G03F 7/70916; G03F 7/70933; G02B 27/0006; G21K 1/06
  See application file for complete search history.

(56) References Cited

U.S. PATENT DOCUMENTS

| | | | |
|---|---|---|---|
| 4,137,750 A | 2/1979 | French et al. | |
| 4,148,196 A | 4/1979 | French et al. | |
| 4,528,451 A | 7/1985 | Petric et al. | |
| 4,837,443 A | 6/1989 | Young et al. | |
| 5,094,533 A | 3/1992 | Sawada et al. | |
| 5,147,168 A | 9/1992 | Suwa et al. | |
| 5,997,588 A | 12/1999 | Goodwin et al. | |
| 6,714,624 B2 | 3/2004 | Fornaciari et al. | |

(Continued)

FOREIGN PATENT DOCUMENTS

| | | |
|---|---|---|
| JP | 2010080409 A | 4/2010 |
| WO | 2015090862 A1 | 6/2015 |
| WO | 2016071175 A1 | 5/2016 |

OTHER PUBLICATIONS

International Search Report and Written Opinion in International Application No. PCT/U2022/030143 dated Aug. 22, 2022, 9 pages.

(Continued)

*Primary Examiner* — Peter B Kim
(74) *Attorney, Agent, or Firm* — Suiter Swantz IP

(57) ABSTRACT

Systems and methods for mitigating and reducing contamination of one or more components of overlay inspection systems are disclosed. Specifically, embodiments of the present disclosure may utilize a counterflow of purge gas through a counterflow nozzle to reduce the presence of contaminants within one or more portions of an inspection system. The system may include a source chamber, one or more vacuum chambers, an intermediate focus housing having an aperture, an illumination source configured to generate and direct illumination through the aperture in an illumination direction, and a counterflow nozzle configured to direct a counterflow of purge gas into the source chamber in a direction opposite the illumination direction.

20 Claims, 16 Drawing Sheets

(56) References Cited

U.S. PATENT DOCUMENTS

| | | |
|---|---|---|
| 6,797,617 B2 | 9/2004 | Pomarede et al. |
| 7,328,885 B2 | 2/2008 | Schuermann et al. |
| 7,462,822 B2 | 12/2008 | Gebhardt et al. |
| 7,576,833 B2 | 8/2009 | Poon et al. |
| 7,585,370 B2 | 9/2009 | Gochberg et al. |
| 7,750,327 B2 | 7/2010 | Tran et al. |
| 7,755,070 B2 | 7/2010 | Bruijn et al. |
| 7,807,947 B2 | 10/2010 | Partanen et al. |
| 7,932,990 B2 | 4/2011 | Namba et al. |
| 7,992,322 B2 | 8/2011 | Kim |
| 8,007,871 B2 | 8/2011 | Man et al. |
| 8,084,736 B2 | 12/2011 | Schneider et al. |
| 8,711,346 B2 | 4/2014 | Stokowski |
| 8,785,082 B2 | 7/2014 | Xiong et al. |
| 8,916,831 B2 | 12/2014 | Wang |
| 2006/0019322 A1 | 1/2006 | Ali et al. |
| 2006/0192322 A1 | 8/2006 | Abe et al. |
| 2006/0219959 A1* | 10/2006 | Hergenhan ............ H05G 2/003 250/504 R |
| 2007/0177117 A1 | 8/2007 | Yamashita |
| 2009/0218521 A1 | 9/2009 | Sogard et al. |
| 2009/0314931 A1 | 12/2009 | Ehm et al. |
| 2010/0078578 A1 | 4/2010 | Schuermann et al. |
| 2011/0132108 A1 | 6/2011 | Novosselov et al. |
| 2011/0180734 A1 | 7/2011 | Moriya et al. |
| 2011/0186436 A1 | 8/2011 | Novosselov et al. |
| 2011/0203931 A1 | 8/2011 | Novosselov et al. |
| 2013/0322076 A1 | 12/2013 | Parker et al. |
| 2014/0166051 A1 | 6/2014 | Umstadter et al. |
| 2014/0362366 A1 | 12/2014 | Delgado et al. |
| 2015/0253675 A1* | 9/2015 | Chilese ............... G03F 7/70933 355/67 |
| 2016/0128171 A1 | 5/2016 | Kuritsyn et al. |

OTHER PUBLICATIONS

Gupta et al., "Slip-Boundary Equations for Multicomponent Nonequilibrium Air", NASA Technical Paper 2452, 1985, 16 pages.

Hinkle, L.D., "Effect of purge pressure on desorbing water removal rate", J. Vac. Sci. Technol. A 22(4), Jul./Aug. 2004, 6 pages.

Marrero and Mason, J. Phys. Chem. Ref. Data 1, 3-118 (1972), 117 pages.

N. G. Hadjiconstantinou, "The limits of Navier-Stokes theory and kinetic extensions for describing small-scale gaseous hydrodynamics", Physics of Fluids 18, 111301 (2006), 20 pages.

Nippon Kikai Gakkai Ronbunshu, "Direct numerical simulation of three-dimensional Navier Stokes equations for slit nozzle free jets and experimental verification", B Hen/Transactions of the Japan Society of Mechanical Engineers, Part B, v 56, n 528, p. 2239-2246, Aug. 1990, 8 pages.

SR Mohanty, T Sakamoto, Y Kobayashi, et. al, "Influence of electrode separation and gas curtain on extreme ultraviolet emission of a gas jet z-pinch source", Applied Physics Letters, 89, 041502, 2006, 4 pages.

* cited by examiner

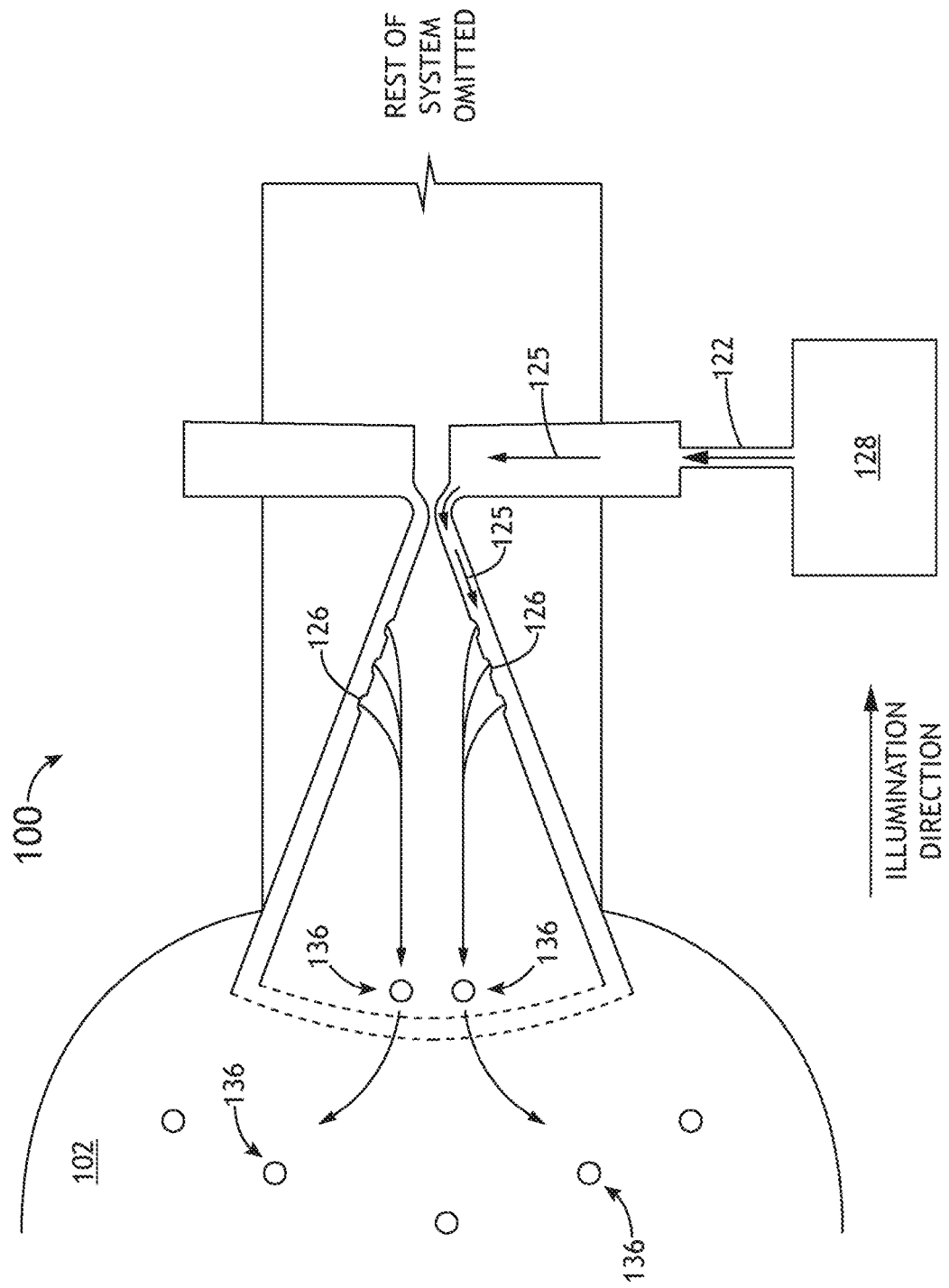

COUNTERFLOW GAS NOZZLE FOR CONTAMINATION MITIGATION IN EXTREME ULTRAVIOLET INSPECTION SYSTEMS

TECHNICAL FIELD

The present disclosure generally relates to the field of semiconductor inspection, and, in particular, to extreme ultraviolet-based inspection systems with contamination mitigation.

BACKGROUND

As the demand for lithography-based device structures having ever-smaller features continues to increase, the need for improved illumination sources used for lithography and inspection of the associated reticles that lithographically print these ever-shrinking devices continues to grow. Certain such illumination sources, utilized in lithography and inspection systems, are inspection systems that utilize extreme ultraviolet (EUV) light, vacuum ultraviolet (VUV) light, deep ultraviolet (DUV) light, or ultraviolet (UV) light.

In many cases, inspection systems, and especially their optics, need to operate in a clean, vacuum environment. However, contaminants that tend to foul the vacuum environment cannot be completely removed from the system. Such is the case, for example, when components of the inspection system, such as certain optical surfaces, contain contaminants. As a result, the optics of the inspection system (in many cases located within a vacuum chamber), are exposed to a partial pressure of contaminants, such as hydrocarbons and gas phase $H_2O$. These contaminants, when exposed to the radiation within the system (e.g., as may be the case during an illumination process), will lead to the growth of carbon and/or oxides optical surfaces of the system, such as mirrors. In the case of mirrors, the contamination will cause a reflectivity drop, resulting in a phase change in the light incident upon a given mirror. Both of these effects, if unchecked, will cause a degradation of the optics over time, leading to a failure of the optical system.

Therefore, it is desirable to provide a method and system that cure the defects of the prior art identified above.

SUMMARY

An optical system is disclosed, in accordance with one or more embodiments of the present disclosure. In one embodiment, the optical system includes a source chamber. In another embodiment, the optical system includes one or more vacuum chambers containing a set of imaging optics. In another embodiment, the optical system includes an intermediate focus housing having an aperture, wherein the intermediate focus housing is coupled to the source chamber and the one or more vacuum chambers. In another embodiment, the optical system includes an illumination source configured to generate illumination and direct the illumination through one or more portions of the source chamber. In another embodiment, the optical system includes a set of illumination optics configured to receive at least a portion of the illumination from the illumination source and direct at least a portion of the illumination in an illumination direction via an illumination axis to a sample, wherein the illumination axis is configured such that at least a portion of the illumination is transmitted through the aperture. In another embodiment, the optical system includes a purge gas inlet coupled to the intermediate focus housing, wherein the purge gas inlet is configured to deliver a purge gas to one or more purge gas ducts. In another embodiment, the optical system includes a counterflow nozzle coupled to the intermediate focus housing and at least partially disposed within the source chamber, wherein the counterflow nozzle is configured to receive the purge gas and direct, via the one or more purge gas ducts, a counterflow of the purge gas into the source chamber in a direction opposite the illumination direction, the counterflow of the purge gas being configured to mitigate contamination within the one or more vacuum chambers by reducing the transmission of one or more volatile species contaminants into the one or more vacuum chambers.

An apparatus is disclosed, in accordance with one or more embodiments of the present disclosure. In one embodiment, the apparatus includes an intermediate focus housing, wherein the intermediate focus housing is coupled to each of a source chamber and one or more vacuum chambers, and wherein the intermediate focus housing includes an aperture. In another embodiment, the apparatus includes a purge gas inlet coupled to the intermediate focus housing, wherein the purge gas inlet is configured to deliver a purge gas to one or more purge gas ducts. In another embodiment, the apparatus includes a counterflow nozzle coupled to the intermediate focus housing and at least partially disposed within the source chamber, wherein the counterflow nozzle is configured to receive the purge gas and direct, via the one or more purge gas ducts, a counterflow of the purge gas into the source chamber in a direction opposite the illumination direction, the counterflow of the purge gas being configured to mitigate contamination within the one or more vacuum chambers by reducing the transmission of one or more volatile species contaminants into the one or more vacuum chambers.

A method of reducing optical system contamination is disclosed, in accordance with one or more embodiments of the present disclosure. In one embodiment, the method includes generating illumination and directing at least a portion of the illumination in an illumination direction to one or more portions of a source chamber. In another embodiment, the method includes directing at least a portion of the illumination through an aperture of an intermediate focus housing, wherein the intermediate focus housing is disposed between the source chamber and one or more vacuum chambers. In another embodiment, the method includes providing a purge gas to a counterflow nozzle coupled to the intermediate focus housing and at least partially disposed within the source chamber. In another embodiment, the method includes generating a counterflow of the purge gas through the counterflow nozzle.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and, together with the general description, serve to explain the principles of the invention.

BRIEF DESCRIPTION OF THE DRAWINGS

The numerous advantages of the disclosure may be better understood by those skilled in the art by reference to the accompanying figures.

FIG. 1C illustrates a conceptual view of an optical system, in accordance with one or more embodiments of the present disclosure.

DETAILED DESCRIPTION

Figure 1A:
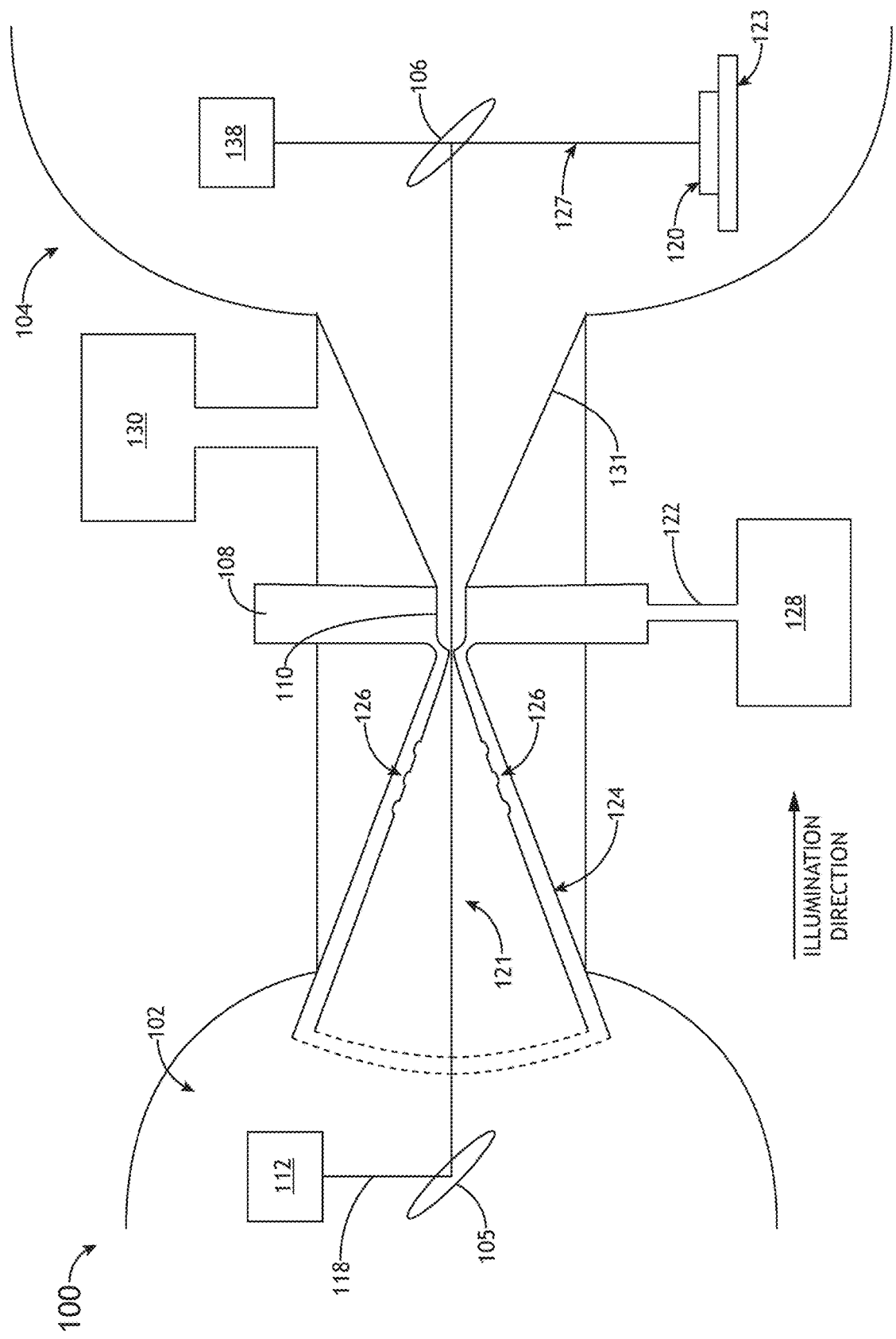
FIG. 1A illustrates a conceptual view of an optical system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to systems and methods for cleaning optical surfaces of overlay inspection systems. In particular, systems and methods for optical-path coupling of light for in-situ photochemical cleaning in projection imaging systems are disclosed.

It is recognized herein that contamination of optical surfaces within an inspection system may occur when volatile organic contaminant species adsorb on the optical surfaces such that they may interact with energetic radiation (e.g., EUV light or VUV light) to produce a carbonaceous buildup in the areas exposed to the energetic radiation. The presence of a tiny amount of buildup (e.g., buildup having a height of only a few nanometers) may cause significant degradations in the performance of the optical elements of the inspection system.

Contaminant buildups on optical surfaces of an inspection system may be removed by one or more photochemical reactions. For example, deposited carbonaceous buildups may be removed via one or more reactions with an ionic or free-radical species (e.g., oxygen (1D) and other excited states of oxygen, as well as excited states of nitrogen, fluorine, or the like). The ionic or free-radical species may be generated when a precursor gas (e.g., ozone) reacts with a photon of sufficient energy (e.g., a EUV, VUV, DUV, or UV photon). In this way, irradiation of an optical surface with illumination of sufficient energy in the presence of a precursor gas may cause the removal of contaminants built up on the optical surface.

Alternatively, to reduce the need for contamination removal, contamination within inspection systems may be removed or manipulated away from optical elements. For example, some techniques for the reduction of contamination within optical systems involve the use of optical windows to prevent the transmission of contaminants within an optical system. However, optical windows are not suitable for use in certain types of optical systems, including, without limitation, EUV systems, because of the high probability of EUV absorption by the optical window. By way of another example, other techniques for the reduction of contamination within optical systems involve the use of gas "curtains" configured to prevent migration of particulates within the optical system through the defection of larger, particulate contaminants by cross-flowing gas "curtains" in one or more areas of an optical system. However, such techniques are not effective against all types of contamination, such as the diffusion of gaseous hydrocarbon particulates within the system 100. In this sense, it is desirable to have systems and methods configured to cure the shortcomings of the current techniques, including by reducing contamination by gaseous hydrocarbon particulates while providing an unobstructed pathway for illumination such that inspection processes may be performed.

As described in greater detail herein, embodiments of the present disclosure may utilize a counterflow of purge gas through a counterflow nozzle to reduce the presence of contaminants within one or more portions of an inspection system.

Figure 1B:
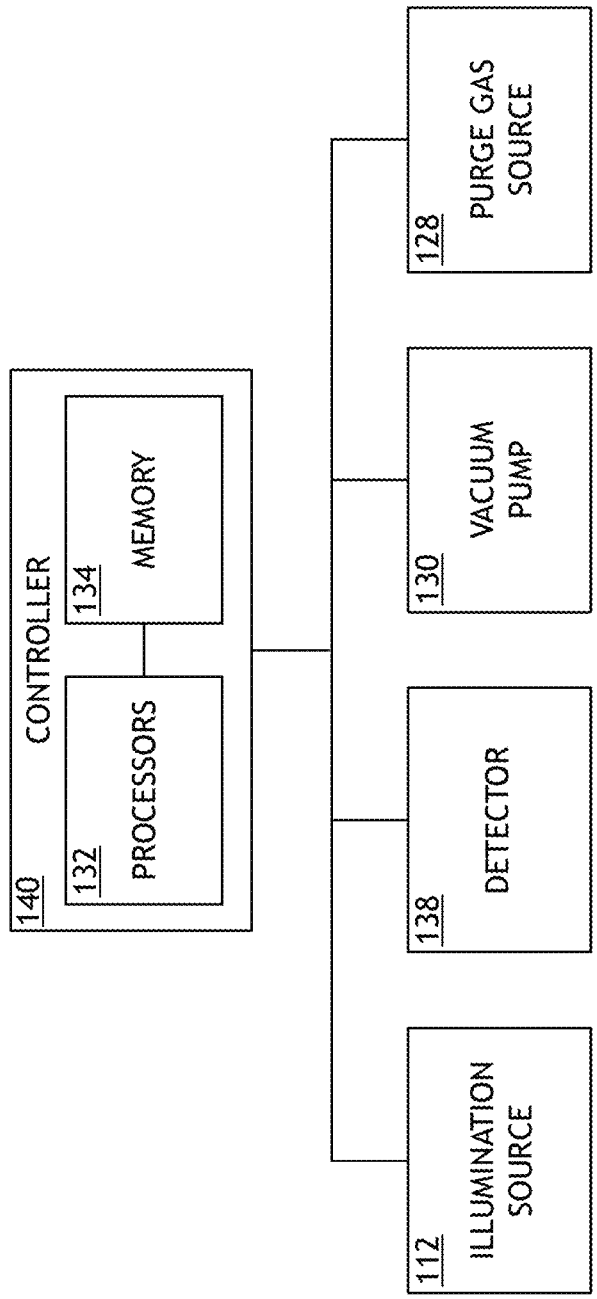
FIG. 1B illustrates a block diagram view of an optical system, in accordance with one or more embodiments of the present disclosure.

FIGS. 1A through 1C generally illustrate embodiments of an optical system 100, in accordance with one or more embodiments of the present disclosure.

FIG. 1A illustrates a conceptual view of an optical system 100, in accordance with one or more embodiments of the present disclosure.

In one embodiment, the system 100 includes a source chamber 102. The source chamber 102 may be coupled to one or more vacuum chambers 104. The source chamber 102 may have a source chamber pressure, and the one or more vacuum chambers may have a vacuum chamber pressure. In some embodiments, the vacuum chamber pressure may be less than the source chamber pressure. For example, the source chamber pressure may be approximately $10^{-2}$ torr, while the vacuum chamber pressure may be approximately $10^{-8}$ torr. Each of the source chamber 102 and the one or more vacuum chambers 104 may contain a mixture of one or more gases, including, without limitation, oxygen, nitrogen, argon, gaseous water, and/or xenon. The source chamber 102 may also contain gaseous hydrocarbons contaminants which may result in undesirable carbonaceous buildups on one or more elements of the system 100. The source chamber pressure may be maintained by one or more vacuum pumps coupled to the source chamber 102 (not shown). The vacuum chamber pressure may be maintained by one or more vacuum pumps coupled to the one or more vacuum chambers (e.g., pump 130). It is noted that the one or more vacuum pumps may be configured to generate, within the source chamber 102 and/or the one or more vacuum chambers 104, a high vacuum environment suitable for inspection (e.g., EUV inspection). Alternatively, the one or more vacuum pumps may be configured to generate, within the source chamber 102 and/or the one or more vacuum chambers 104, a low vacuum environment.

The one or more vacuum pumps of the present disclosure, including, without limitation, pump 130, may include a pump system suitable for establishing and maintaining a low-pressure or vacuum environment within the source chamber 102 and/or the one or more vacuum chambers 104. For example, the one or more vacuum pumps may include a turbo pump and/or a roots pump backed with a dry pumping unit and equipped with an exhaust system (not shown).

In one embodiment, the system 100 includes an illumination source 112 configured to generate illumination 118. In another embodiment, the system 100 includes a set of illumination optics 105 configured to direct at least a portion of the light to one or more samples 120. For example, the illumination source 112 may include, but is not limited to, a broadband light source (e.g., a light source suitable for generating EUV, VUV, DUV, and/or UV light), or a narrowband illumination source (e.g., a laser source). The illumination source 112 may include a laser source configured to generate illumination having a wavelength of at least one of approximately 355 nanometers, approximately 266 nanometers, or approximately 193 nanometers. The illumination source 112 may be configured to generate illumination 118 and direct it in an illumination direction (e.g., as shown in FIG. 1A).

The illumination source 112 may be disposed within the source chamber 102. Alternatively, in some embodiments, the illumination source 112 may be disposed outside of the source chamber 102 and may be configured to direct illumination 118 into or through one or more portions of the source chamber 102.

In one embodiment, the illumination optics 105 may be configured to direct illumination 118 emanating from the illumination source 112 to the one or more samples 120 disposed on a stage 123 along an illumination axis 121 (e.g., an illumination pathway). The one or more samples 120 may include, but are not limited to, a wafer (e.g., semiconductor wafer) or a reticle. The illumination optics 105 may be disposed within the source chamber 102. Alternatively, in some embodiments, the illumination optics may be disposed outside of the source chamber 102 and configured to direct illumination 118 to one or more portions of the system 100 through the source chamber 102.

The illumination source 112 may be configured to generate illumination such that the illumination 118 is a uniform irradiating illumination. In another embodiment, the illumination source 112 may be configured to generate illumination such that the illumination 118 comprises one or more scanning rasters.

In another embodiment, the system 100 may include set of imaging optics 106 configured to receive illumination from the surface of the one or more samples 120 and direct the illumination from the one or more samples 120 to a detector 138 via an imaging axis 127 (e.g., an illumination collection pathway). For example, the imaging optics 106 may include one or more projection optics suitable for collecting light scattered, reflected, diffracted or otherwise emanating from the sample 120 and directing the light to one or more detectors 138 (e.g., CCD, TDI-CCD, PMT and the like). In another embodiment, the system 100 includes a controller (as shown in FIG. 1B) for receiving and/or analyzing signals indicative of illumination collected from the sample 120 via the imaging optics 106 and the detector 138.

It is noted that, as illustrated by FIG. 1A, embodiments of the present disclosure may be configured to perform one or more inspection processes. For example, as shown in FIG. 1A, the optical system 100 may be configured to perform one or more inspection processes with respect to the sample 120.

The system 100 may include an intermediate focus housing 108 coupled to each of the source chamber 102 and the one or more vacuum chambers 104. The intermediate focus housing may include an aperture 110 configured to allow transmission of light (e.g., illumination 118) and/or gas between the source chamber 102 and the one or more vacuum chambers 104. The aperture 110 may have a diameter configured to allow the transmission of radiation and/or gas from one side of the aperture 110 (e.g., the source chamber 102) to another side of the aperture 110 (e.g., the one or more vacuum chambers 104). For example, in some embodiments, the aperture 110 may have a diameter between approximately one millimeter and approximately two millimeters. The aperture 110 may be configured such that the area of the aperture 110 is open, such that fluid communication of gas between the source chamber 102 and the one or more vacuum chambers 104 is possible. In this sense, the aperture 110 may be configured to reduce absorption of illumination that may otherwise occur (e.g., in the case of an optical window of an EUV optical system).

Though not shown, the intermediate focus housing 108 may comprise a plurality of components that, when coupled, form the intermediate focus housing 108. For example, the intermediate focus housing 108 may include, but is not limited to, an outer housing component, a gate valve component configured to actuate within the intermediate focus housing 108 such that a flow of air through the aperture may be blocked, an inner gas nozzle component, and/or an outer shroud component. It is specifically contemplated that, for purposes of the present disclosure, reference to a design and/or configuration of the intermediate focus housing 108 is to be interpreted as, in some embodiments, referring to a design and/or configuration of any one of the outer housing component, the gate valve component, the inner gas nozzle component, and/or the outer shroud component of the intermediate focus housing.

The intermediate focus housing 108 may be coupled to or may be formed to include a counterflow nozzle 124. The counterflow nozzle 124 may be partially disposed within the source chamber 102. The counterflow nozzle 124 may be of any shape or configuration known in the art to be suitable for the purposes contemplated by the present disclosure. For example, in some embodiments, the counterflow nozzle 124 may be of a divergingly conical and/or a cylindrical shape.

The counterflow nozzle 124 may include one or more purge gas ducts 126 configured to transmit purge gas through the counterflow nozzle 124 and into the source chamber 102. The one or more purge gas ducts 126 may be formed within the counterflow nozzle 124 and/or one or more portions of the intermediate focus housing 108. The purge gas may be directed to the one or more purge gas ducts 126 from a purge gas source 128 via a purge gas inlet 122. The purge gas inlet 122 may be coupled to at the purge gas source 128 and at least one of the intermediate focus housing 108, the counterflow nozzle 124, or the one or more purge gas ducts 126.

The purge gas may include any gas known in the art to be suitable for the purposes contemplated by the present disclosure. For example, the purge gas may include, but is not limited to, oxygen, nitrogen, fluorine, xenon, argon, or any combination thereof. The purge gas source 128 may include one or more pumps (e.g., turbomolecular pumps).

The purge gas may have a purge gas pressure. In some embodiments, the purge gas pressure may be greater than the vacuum chamber pressure of the one or more vacuum chambers 104. The purge gas pressure may be approximately equivalent to the source chamber pressure of the source chamber 102. In this sense, with respect to transmission of illumination 118 along the illumination direction, the optical system 100 may be configured (e.g., as a result of the relative values of the purge gas pressure, the vacuum chamber pressure, and/or the source chamber pressure) such that minimal flow of gas may occur in the illumination direction (e.g., from the source chamber 102 to the one or more vacuum chambers 104).

It is noted that, though not shown in each case, the system 100 may include one or more devices and/or components configured to manipulate the flow of gas within the system. Additionally, in some embodiments, the system 100 may include one or more elements configured to generate and/or maintain a vacuum environment within one or more portions of the system 100. For example, in some embodiments, the system 100 may include a skimmer nozzle 131 disposed within one or more portions of the one or more vacuum chambers.

FIG. 1B illustrates a block diagram view of an optical system 100, in accordance with one or more embodiments of the present disclosure. In some embodiments, the system 100 may include a controller 140 communicatively coupled to one or more other elements of the system 100 (e.g., the illumination source 112, the detector 138, the one or more vacuum pumps 130, or the purge gas source 128). The controller 140 may include one or more processors 132 communicatively coupled to memory 134. The one or more processors 132 may be configured to execute a set of program instructions stored in the memory 134 for acquiring inspection and/or measurement data from one or more components of the system 100 (e.g., the detector 138) and/or for controlling one or more portions of the system 100 (e.g., the illumination source 112, the detector 138, the one or more vacuum pumps 130, the purge gas source 128, the stage 123, or the like).

FIG. 1C illustrates an optical system 100, in accordance with one or more embodiments of the present disclosure. As show in FIG. 1C, and as previously described, the counterflow nozzle 124 may include one or more purge gas ducts 126 configured to transmit purge gas through the counterflow nozzle 124 and into the source chamber 102. The purge gas source 128 may be configured to direct purge gas through the purge gas inlet 122 to the one or more purge gas ducts 126. The purge gas may then be directed through a portion of the counterflow nozzle 124 to the source chamber 102. In this sense, the system 100 may be configured such that the flow 125 of purge gas is directed to the source chamber 102 (e.g., via the purge gas inlet 122 and the one or more purge gas ducts 126) in a direction opposite a direction of illumination. For example, the system 100 (e.g., the illumination source 112, illumination optics 105, etc.) may be configured such that the illumination direction is a direction toward the one or more vacuum chambers 104 and away from the source chamber 102.

The system 100 may be configured to mitigate contamination within one or more portions of the system 100. For example, as shown in FIG. 1B, the flow 125 of purge gas may be configured to prevent transmission of one or more contaminants 136 from the source chamber 102 to the one or more vacuum chambers 104 (where inspection processes may be performed). By way of another example, contaminants 136 that may be present in the source chamber 102 and that would otherwise be prone to fluid transmission to the one or more vacuum chambers 104 (e.g., such as through the aperture 110 of the intermediate focus housing 108) may be prevented from flowing to the one or more vacuum chambers 104 by the flow 125 of purge gas. In this sense, the system 100 may be configured such that illumination 118 is directed through the aperture 110, while the transmission of contaminants 136 through the aperture 110 is mitigated.

Though shown with reference to embodiments of the system 100 having a single vacuum chamber 104, in some embodiments, the system 100 may include a plurality of vacuum chambers 104. The plurality of vacuum chambers 104 may be coupled such that any matter within any one of the plurality of vacuum chambers may communicate fluidly throughout the interior of any other of the plurality of vacuum chambers. One or more elements of the system 100 may be disposed within the plurality of vacuum chambers 104. For example, the imaging optics 106, the detector 138, the sample 120, and/or the stage 123 may be disposed within the one or more vacuum chambers 104.

It is noted that one or more aspects of the intermediate focus housing 108, the counterflow nozzle 124, the one or more purge gas ducts 126, the purge gas inlet 122, and/or the purge gas source 128 may be configured and/or designed to achieve a laminar flow of purge gas (e.g., flow 125) within the counterflow nozzle 124 and/or the source chamber 102. For example, any of the intermediate focus housing 108, the counterflow nozzle 124, the one or more purge gas ducts 126, the purge gas inlet 122, and/or the purge gas source 128 may be configured to include orifices, chambers, pathways, ducts, or the like that reduce turbulence within a flow of purge gas.

It is further noted that one or more aspects of the intermediate focus housing 108, the counterflow nozzle 124, the one or more purge gas ducts 126, the purge gas inlet 122, and/or the purge gas source 128 may be configured and/or designed to achieve desired level of protection from contaminants with respect to the one or more vacuum chambers 104. For example, the intermediate focus housing 108, the counterflow nozzle 124, the one or more purge gas ducts 126, the purge gas inlet 122, and/or the purge gas source 128 may be configured to achieve a protection factor with respect to the system 100.

The protection factor of the system 100 may be expressed as a ratio of a partial pressure of a gas in one portion of the system 100 and a partial pressure of the gas in another portion of the system 100. For example, the protection factor of the system 100 may be expressed as a ratio of a partial pressure of a gas in the source chamber 102 (PPsc) and a partial pressure of the gas in the one or more vacuum chambers 104 (PPvc). It is noted that, for purposes of the present disclosure, the protection factor of the system 100 may be expressed as a ratio of a partial pressure of any gas in the source chamber 102 (PPsc) and a partial pressure of the same gas in the one or more vacuum chambers 104 (PPvc), including, without limitation, when such gas comprises argon, xenon, gaseous hydrocarbons (e.g., carbonaceous contaminants), and/or gaseous water.

In some embodiments, the protection factor of the system 100 may comprise a function of one or more variables with respect to the operation of the system 100. For example, the protection factor may be a function of one or more aspects of the purge gas utilized in the system. Specifically, the protection factor may be a function of the flow 125 of the purge gas, which flow 125 may be influenced by the design and/or configuration of the intermediate focus housing 108, the counterflow nozzle 124, the one or more purge gas ducts 126, the purge gas inlet 122, and/or the purge gas source 128.

For example, FIGS. 2A-7C generally illustrate one or more aspects of various embodiments of the counterflow nozzle 124, in accordance with one or more embodiments of the present disclosure. The various embodiments of the counterflow nozzle 124 illustrated in the accompanying figures may be configured such that a desired protection factor is achieved within the system 100 (e.g., as a result of one or more design and/or configuration considerations with respect to the intermediate focus housing 108, the counterflow nozzle 124, the one or more purge gas ducts 126, the purge gas inlet 122, and/or the purge gas source 128 of the particular embodiment).

Figure 2A:
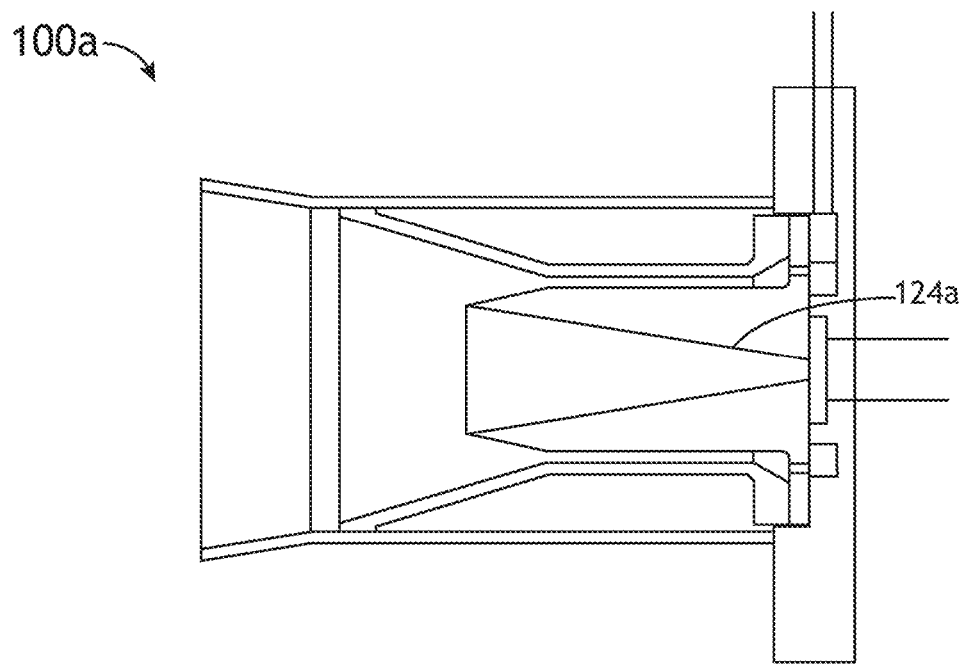
FIG. 2A depicts a counterflow nozzle of an optical system, in accordance with one or more embodiments of the present disclosure.
Figure 2B:
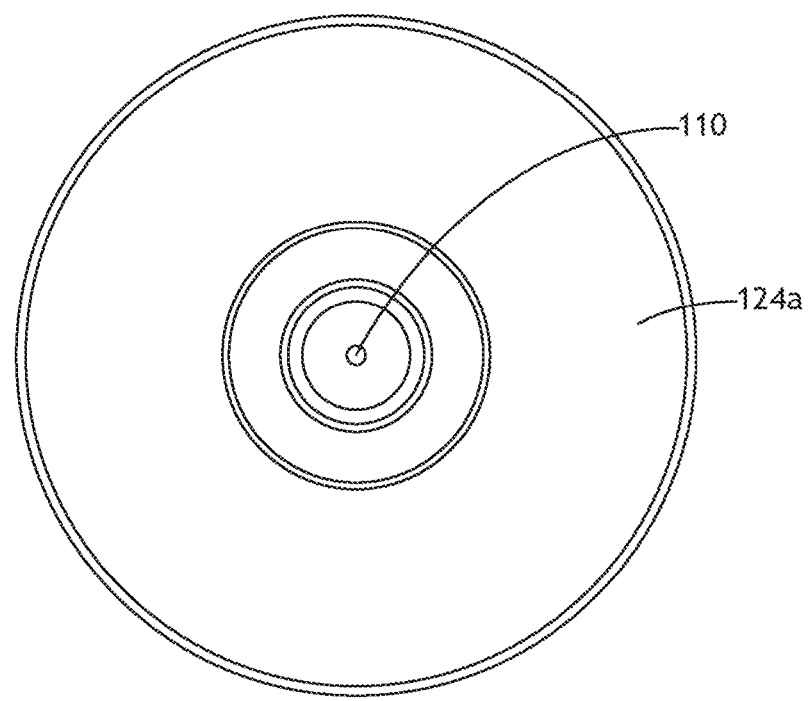
FIG. 2B depicts a counterflow nozzle of an optical system, in accordance with one or more embodiments of the present disclosure.
Figure 2C:
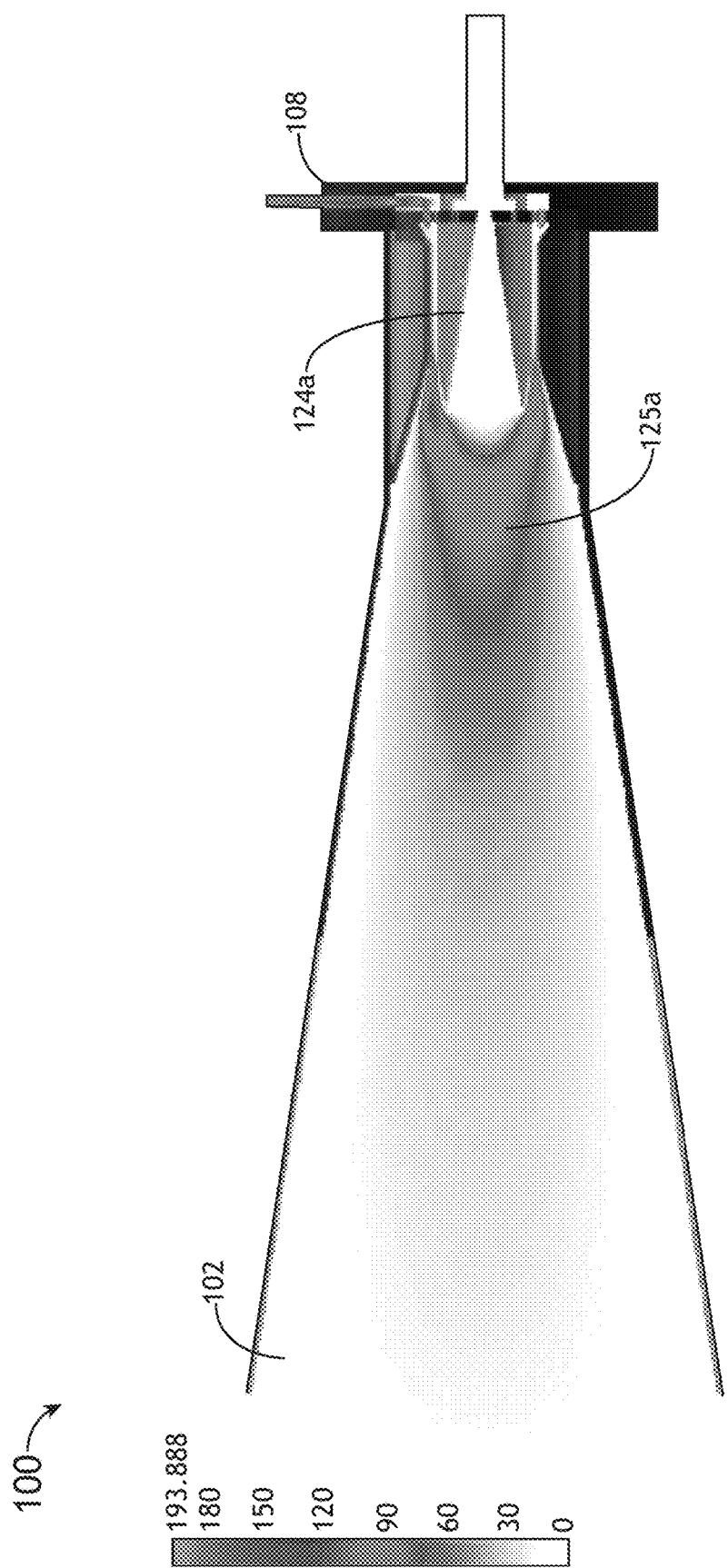
FIG. 2C depicts a counterflow nozzle of an optical system, in accordance with one or more embodiments of the present disclosure.

Turning specifically to FIGS. 2A-2C, a counterflow nozzle 124a is shown. FIG. 2A illustrates a cross-sectional view of a portion of the system 100a, including the intermediate focus housing 108, the counterflow nozzle 124a, and a portion of the source chamber 102. FIG. 2B illustrates a cross-sectional view of the counterflow nozzle 124a (e.g., as viewed from one end of the counterflow nozzle 124a).

The shape of the counterflow nozzle 124a and/or the one or more purge gas ducts 126a may be configured such that the fluid properties of a gas (e.g., the purge gas) flowing through the counterflow nozzle 124a are desirable (e.g., result in a desirable protection factor). For example, as shown in FIG. 2C, the flow 125a of purge gas from the counterflow nozzle 124a may have laminar and/or turbulent properties as a result of one or more aspects of the design and/or configuration of the counterflow nozzle 124a and/or the one or more purge gas ducts 126a. In this sense, the design and/or configuration of the counterflow nozzle 124a and/or the one or more purge gas ducts 126a may result in a specific protection factor of the system 100a having the counterflow nozzle 124a when in operation. In the way of an illustrative example, the protection factor of the system 100a including the counterflow nozzle 124a, and wherein the purge gas comprises argon, may be equivalent to approximately 860,000.

Figure 3A:
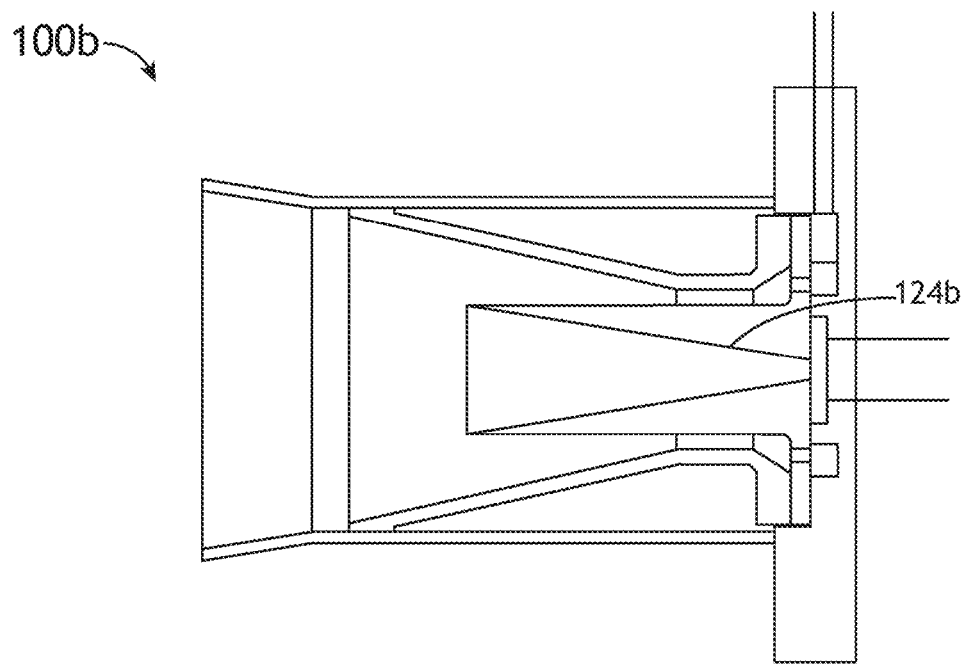
FIG. 3A depicts a counterflow nozzle of an optical system, in accordance with one or more embodiments of the present disclosure.
Figure 3B:
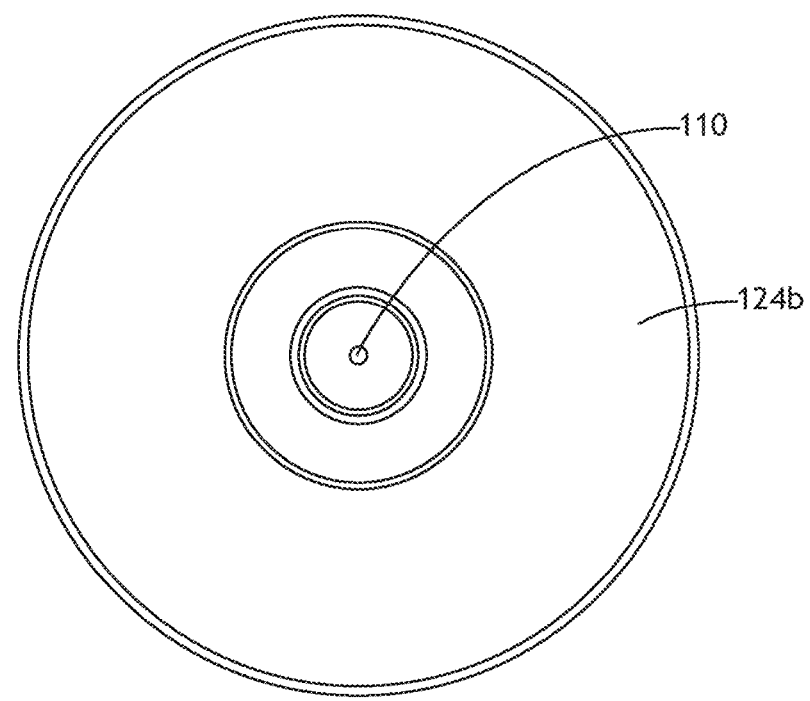
FIG. 3B depicts a counterflow nozzle of an optical system, in accordance with one or more embodiments of the present disclosure.
Figure 3C:
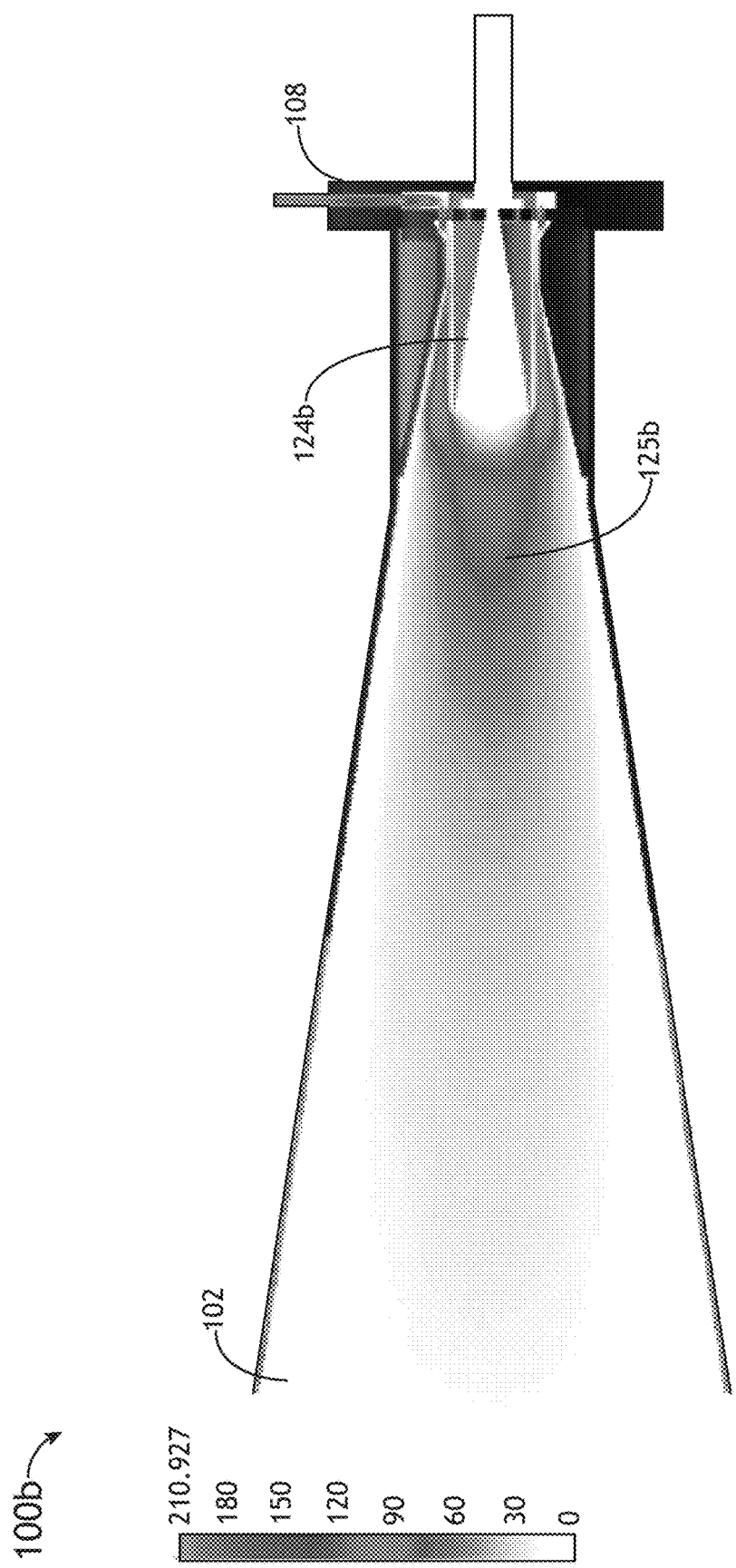
FIG. 3C depicts a counterflow nozzle of an optical system, in accordance with one or more embodiments of the present disclosure.

Turning specifically to FIGS. 3A-3C, a counterflow nozzle 124b is shown. FIG. 3A illustrates a cross-sectional view of a portion of the system 100b, including the intermediate focus housing 108, the counterflow nozzle 124b, and a portion of the source chamber 102. FIG. 3B illustrates a cross-sectional view of the counterflow nozzle 124b (e.g., as viewed from one end of the counterflow nozzle 124b).

The shape of the counterflow nozzle 124b and/or the one or more purge gas ducts 126b may be configured such that the fluid properties of a gas (e.g., the purge gas) flowing through the counterflow nozzle 124b are desirable (e.g., result in a desirable protection factor). For example, as shown in FIG. 3C, the flow 125b of purge gas from the counterflow nozzle 124b may have laminar and/or turbulent properties as a result of one or more aspects of the design and/or configuration of the counterflow nozzle 124b and/or the one or more purge gas ducts 126b. In this sense, the design and/or configuration of the counterflow nozzle 124b and/or the one or more purge gas ducts 126b may result in a specific protection factor of the system 100b having the counterflow nozzle 124b when in operation. In the way of an illustrative example, the protection factor of the system 100b including the counterflow nozzle 124b, and wherein the purge gas comprises argon, may be equivalent to approximately 1,700,000.

Figure 4A:
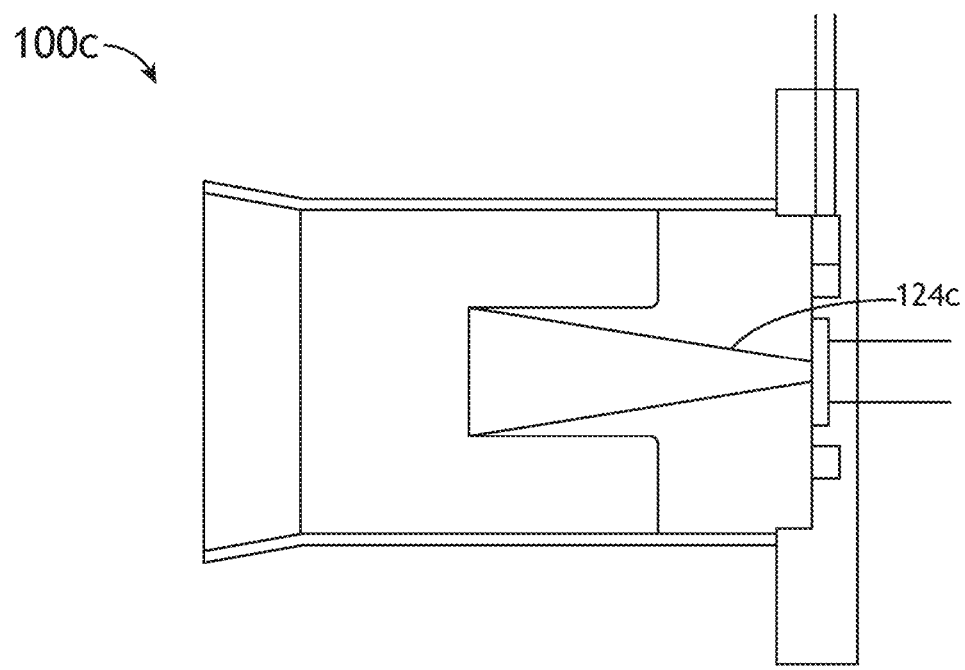
FIG. 4A depicts a counterflow nozzle of an optical system, in accordance with one or more embodiments of the present disclosure.
Figure 4B:
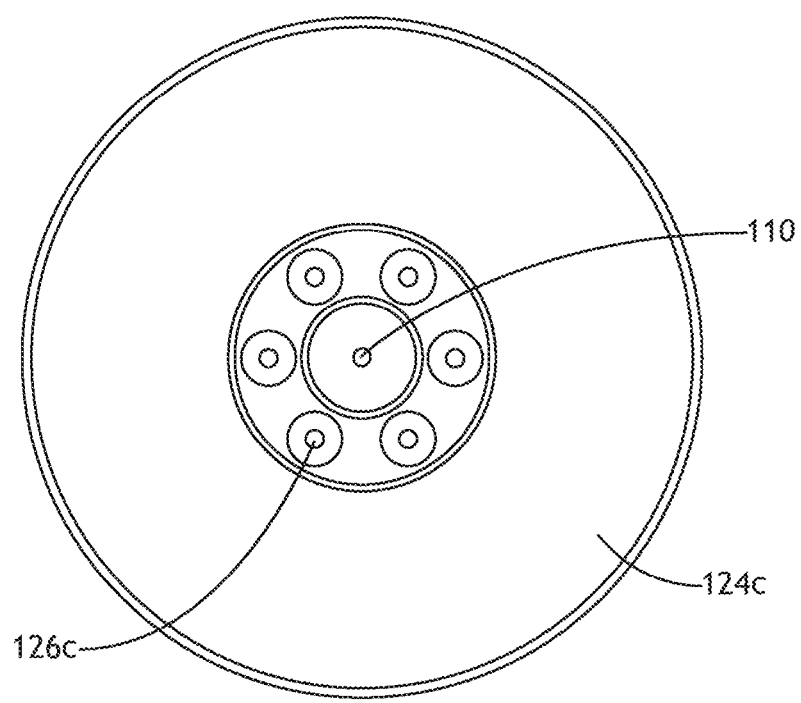
FIG. 4B depicts a counterflow nozzle of an optical system, in accordance with one or more embodiments of the present disclosure.
Figure 4C:
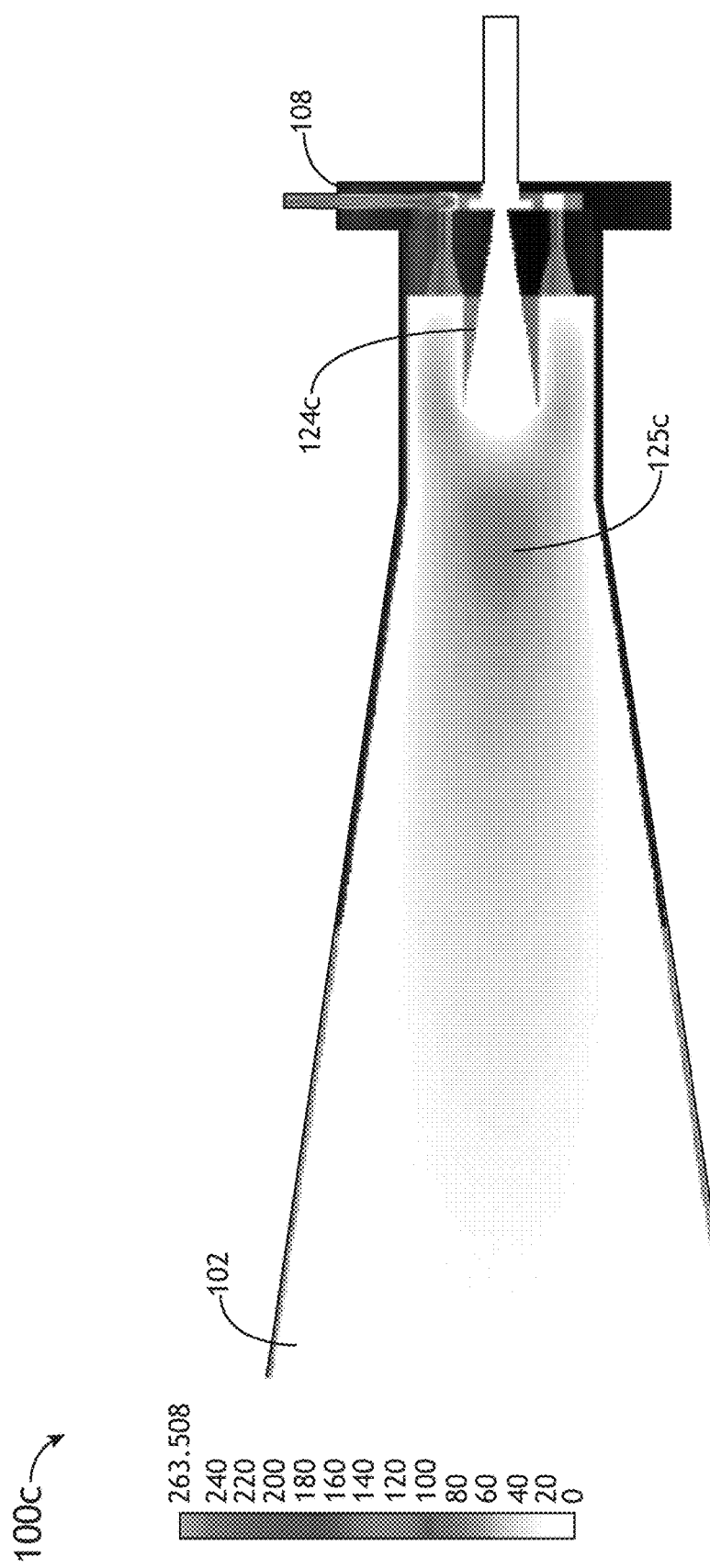
FIG. 4C depicts a counterflow nozzle of an optical system, in accordance with one or more embodiments of the present disclosure.

Turning specifically to FIGS. 4A-4C, a counterflow nozzle 124c is shown. FIG. 4A illustrates a cross-sectional view of a portion of the system 100c, including the intermediate focus housing 108, the counterflow nozzle 124c, and a portion of the source chamber 102. FIG. 4B illustrates a cross-sectional view of the counterflow nozzle 124c (e.g., as viewed from one end of the counterflow nozzle 124c).

The shape of the counterflow nozzle 124c and/or the one or more purge gas ducts 126c may be configured such that the fluid properties of a gas (e.g., the purge gas) flowing through the counterflow nozzle 124c are desirable (e.g., result in a desirable protection factor). For example, as shown in FIG. 4C, the flow 125c of purge gas from the counterflow nozzle 124c may have laminar and/or turbulent properties as a result of one or more aspects of the design and/or configuration of the counterflow nozzle 124c and/or the one or more purge gas ducts 126c. In this sense, the design and/or configuration of the counterflow nozzle 124c and/or the one or more purge gas ducts 126c may result in a specific protection factor of the system 100c having the counterflow nozzle 124c when in operation. In the way of an illustrative example, the protection factor of the system 100c including the counterflow nozzle 124c, and wherein the purge gas comprises argon, may be equivalent to approximately 1,900,000.

Figure 5A:
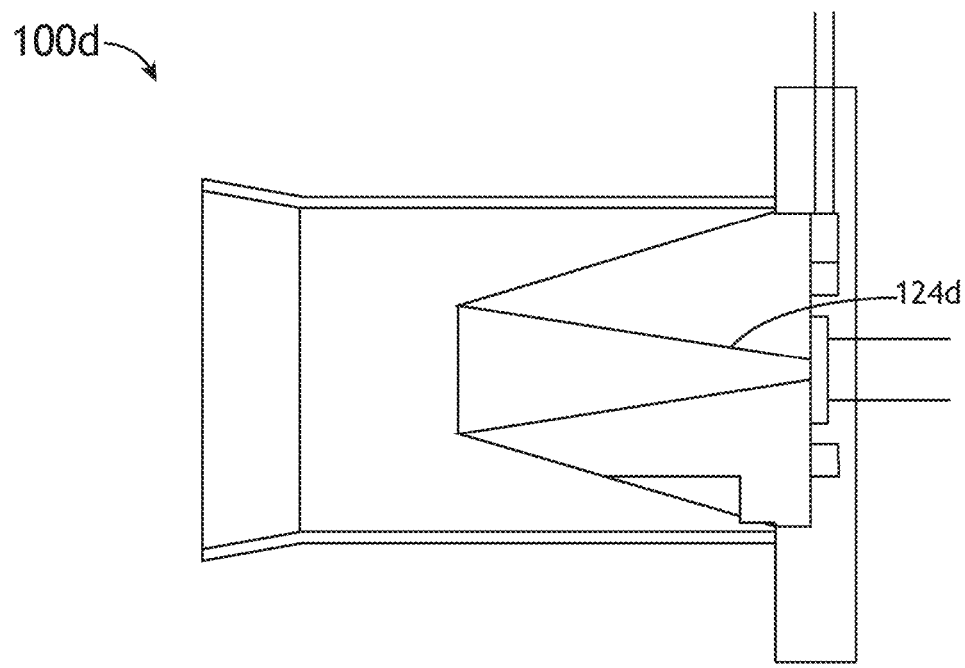
FIG. 5A depicts a counterflow nozzle of an optical system, in accordance with one or more embodiments of the present disclosure.
Figure 5B:
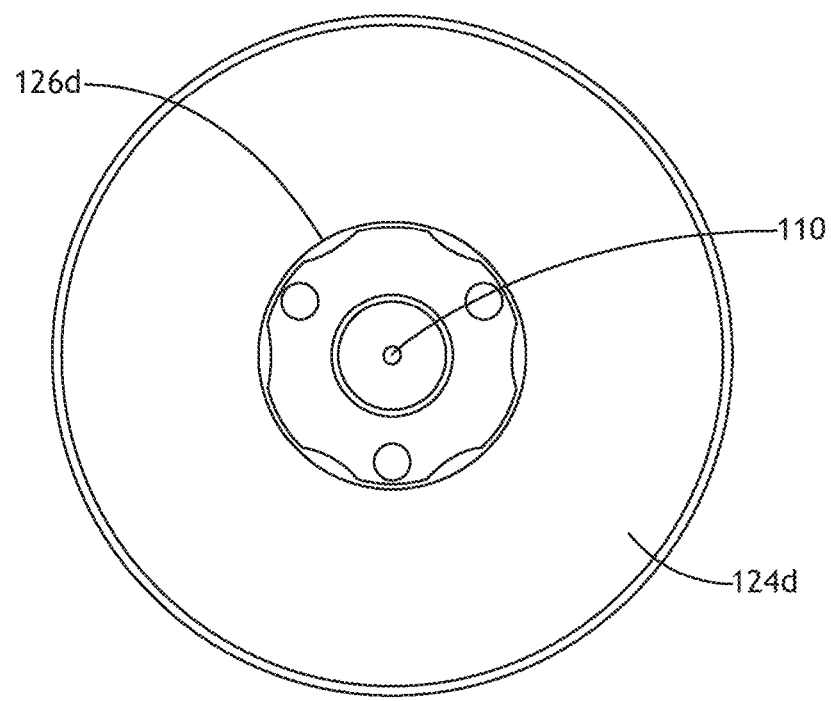
FIG. 5B depicts a counterflow nozzle of an optical system, in accordance with one or more embodiments of the present disclosure.
Figure 5C:
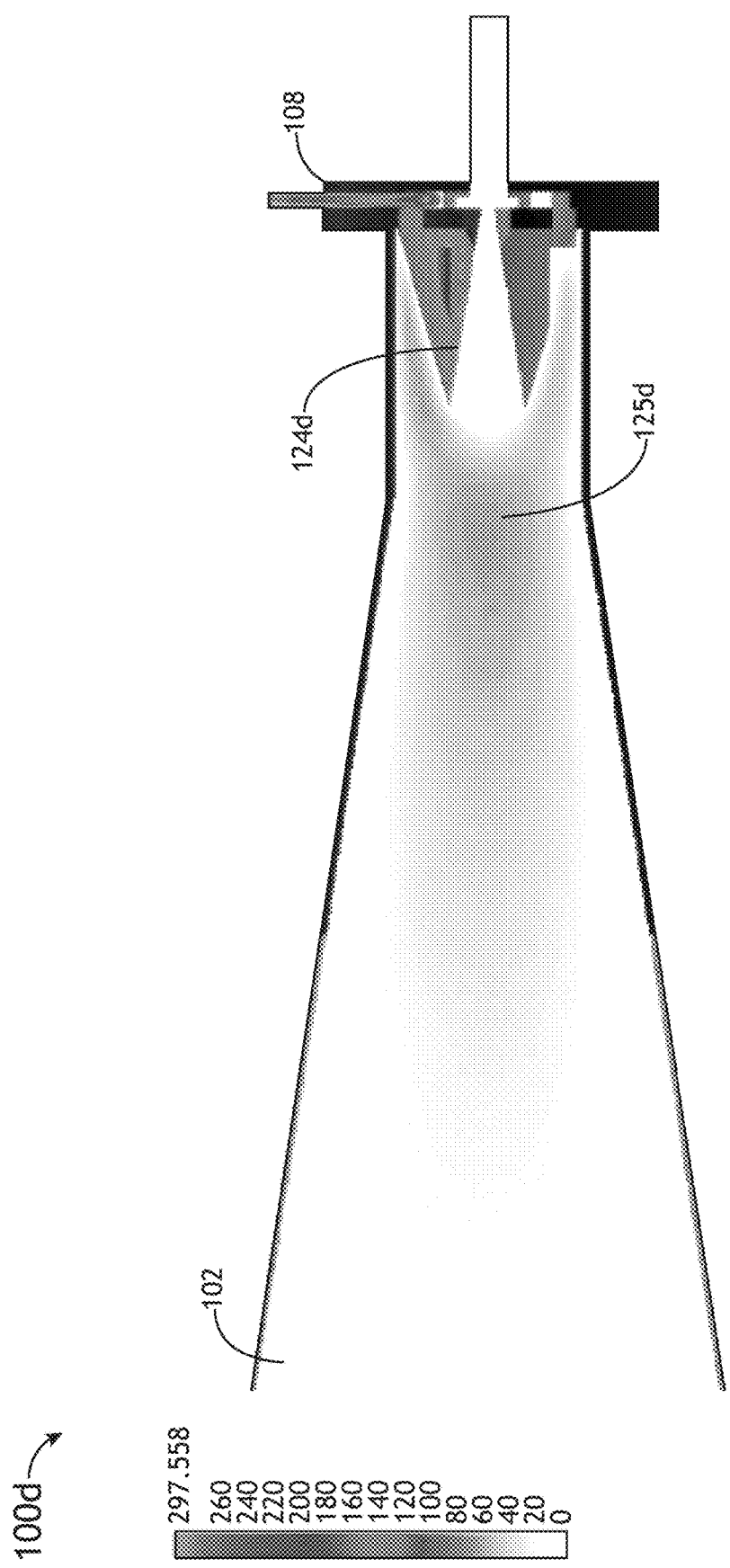
FIG. 5C depicts a counterflow nozzle of an optical system, in accordance with one or more embodiments of the present disclosure.

Turning specifically to FIGS. 5A-5C, a counterflow nozzle 124d is shown. FIG. 5A illustrates a cross-sectional view of a portion of the system 100d, including the intermediate focus housing 108, the counterflow nozzle 124d, and a portion of the source chamber 102. FIG. 5B illustrates a cross-sectional view of the counterflow nozzle 124d (e.g., as viewed from one end of the counterflow nozzle 124d).

The shape of the counterflow nozzle 124d and/or the one or more purge gas ducts 126d may be configured such that the fluid properties of a gas (e.g., the purge gas) flowing through the counterflow nozzle 124d are desirable (e.g., result in a desirable protection factor). For example, as shown in FIG. 5C, the flow 125d of purge gas from the counterflow nozzle 124d may have laminar and/or turbulent properties as a result of one or more aspects of the design and/or configuration of the counterflow nozzle 124d and/or the one or more purge gas ducts 126d. In this sense, the design and/or configuration of the counterflow nozzle 124d and/or the one or more purge gas ducts 126d may result in a specific protection factor of the system 100d having the counterflow nozzle 124d when in operation. In the way of an illustrative example, the protection factor of the system 100d including the counterflow nozzle 124d, and wherein the purge gas comprises argon, may be equivalent to approximately 1,200,000.

Figure 6A:
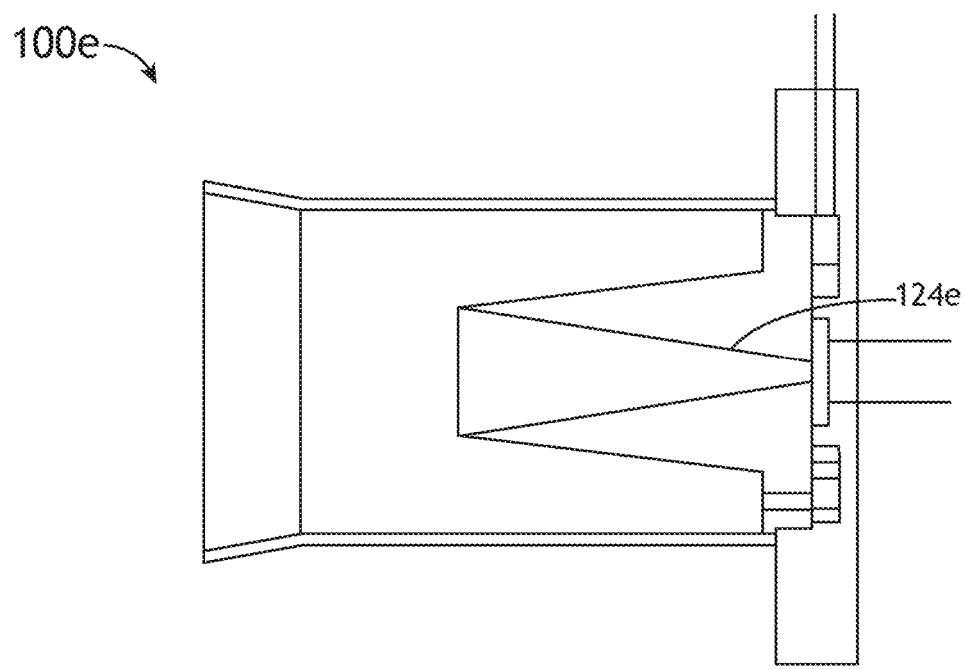
FIG. 6A depicts a counterflow nozzle of an optical system, in accordance with one or more embodiments of the present disclosure.
Figure 6B:
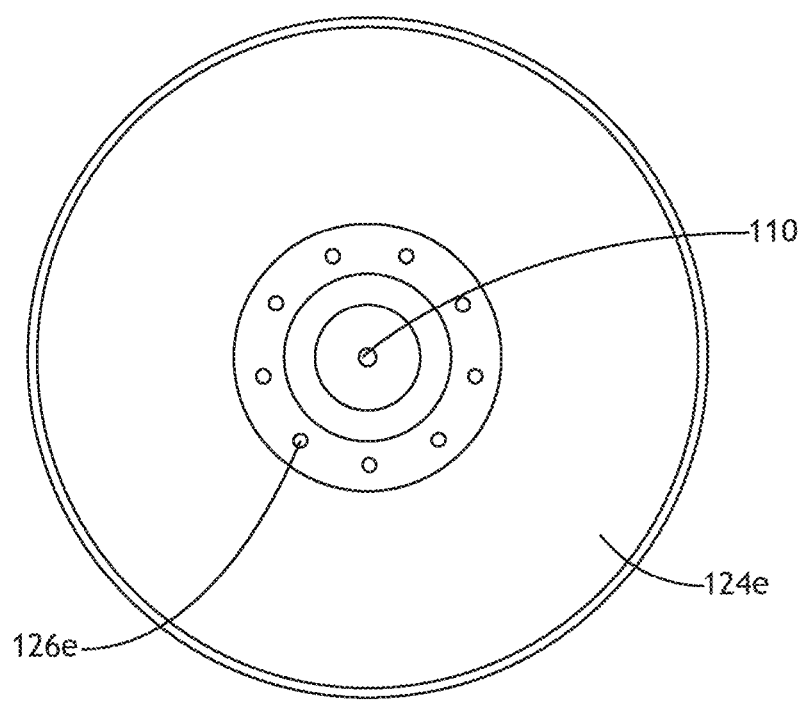
FIG. 6B depicts a counterflow nozzle of an optical system, in accordance with one or more embodiments of the present disclosure.
Figure 6C:
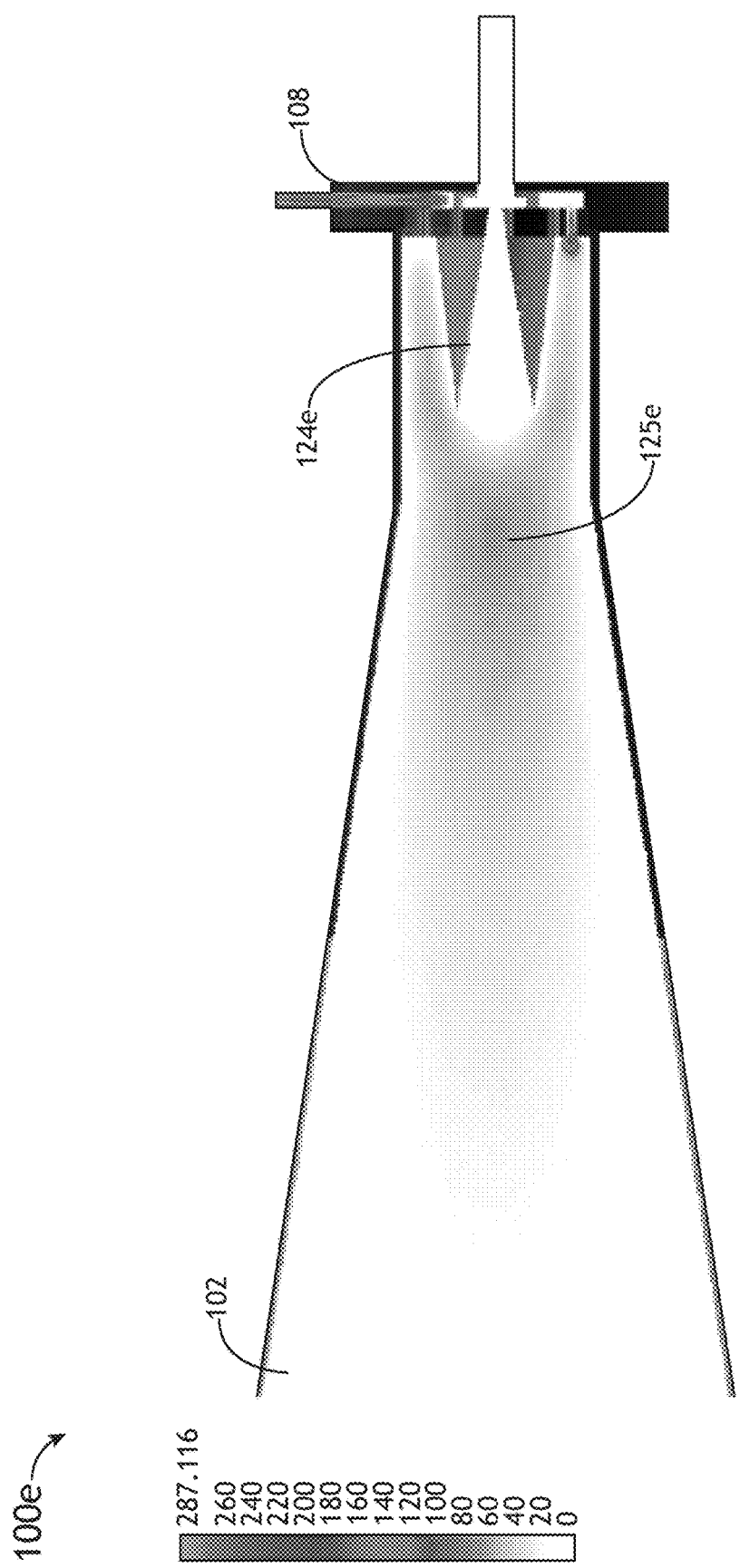
FIG. 6C depicts a counterflow nozzle of an optical system, in accordance with one or more embodiments of the present disclosure.

Turning specifically to FIGS. 6A-6C, a counterflow nozzle 124e is shown. FIG. 6A illustrates a cross-sectional view of a portion of the system 100e, including the intermediate focus housing 108, the counterflow nozzle 124e, and a portion of the source chamber 102. FIG. 6B illustrates a cross-sectional view of the counterflow nozzle 124e (e.g., as viewed from one end of the counterflow nozzle 124e).

The shape of the counterflow nozzle 124e and/or the one or more purge gas ducts 126e may be configured such that the fluid properties of a gas (e.g., the purge gas) flowing through the counterflow nozzle 124e are desirable (e.g., result in a desirable protection factor). For example, as shown in FIG. 6C, the flow 125e of purge gas from the counterflow nozzle 124e may have laminar and/or turbulent properties as a result of one or more aspects of the design and/or configuration of the counterflow nozzle 124e and/or the one or more purge gas ducts 126e. In this sense, the design and/or configuration of the counterflow nozzle 124e and/or the one or more purge gas ducts 126e may result in a specific protection factor of the system 100e having the counterflow nozzle 124e when in operation. In the way of an illustrative example, the protection factor of the system 100e including the counterflow nozzle 124e, and wherein the purge gas comprises argon, may be equivalent to approximately 1,000,000.

Figure 7A:
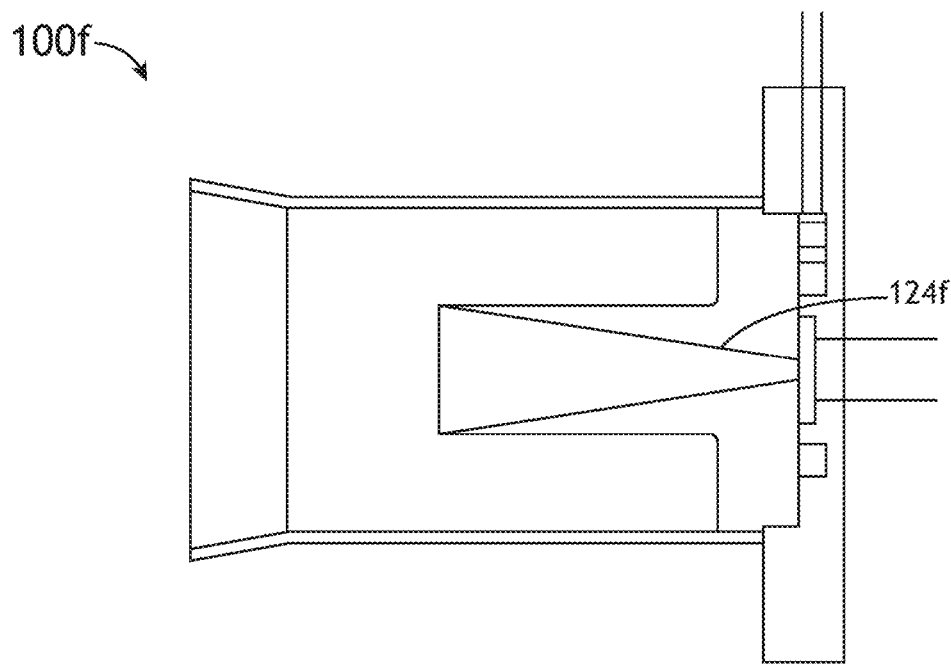
FIG. 7A depicts a counterflow nozzle of an optical system, in accordance with one or more embodiments of the present disclosure.
Figure 7B:
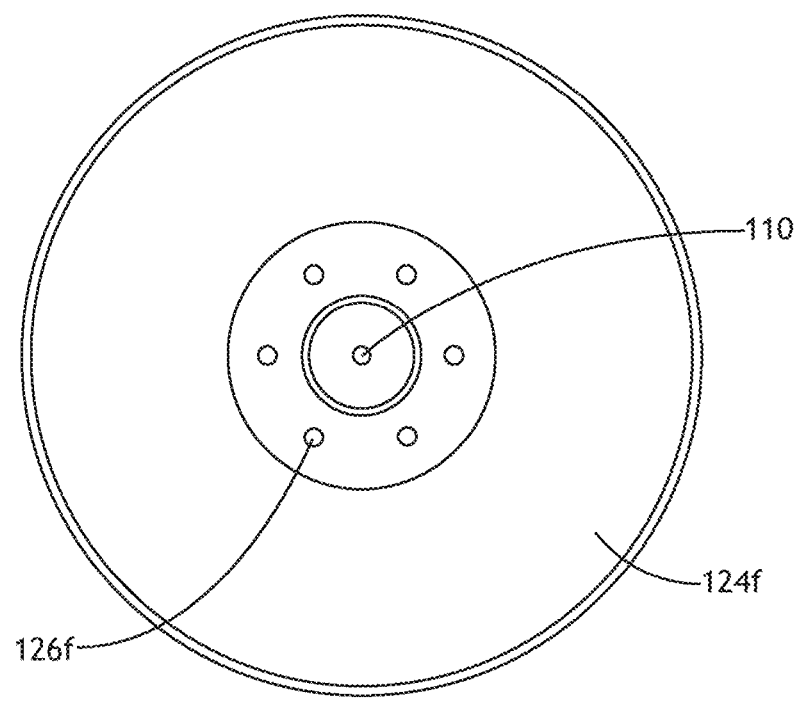
FIG. 7B depicts a counterflow nozzle of an optical system, in accordance with one or more embodiments of the present disclosure.
Figure 7C:
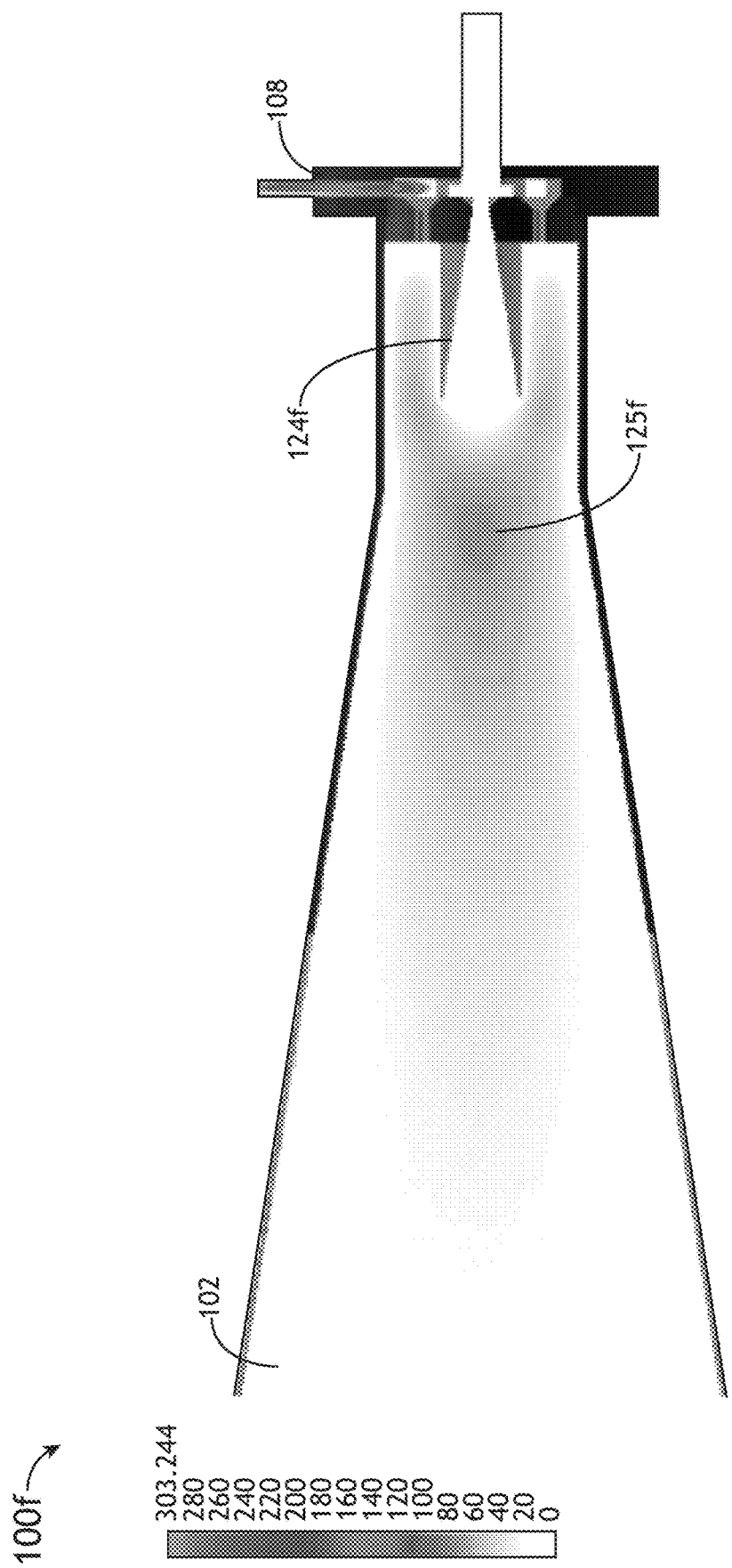
FIG. 7C depicts a counterflow nozzle of an optical system, in accordance with one or more embodiments of the present disclosure.

Turning specifically to FIGS. 7A-7C, a counterflow nozzle 124f is shown. FIG. 7A illustrates a cross-sectional view of a portion of the system 100f, including the intermediate focus housing 108, the counterflow nozzle 124f, and a portion of the source chamber 102. FIG. 7B illustrates a cross-sectional view of the counterflow nozzle 124f (e.g., as viewed from one end of the counterflow nozzle 124f).

The shape of the counterflow nozzle 124f and/or the one or more purge gas ducts 126f may be configured such that the fluid properties of a gas (e.g., the purge gas) flowing through the counterflow nozzle 124f are desirable (e.g., result in a desirable protection factor). For example, as shown in FIG. 7C, the flow 125f of purge gas from the counterflow nozzle 124f may have laminar and/or turbulent properties as a result of one or more aspects of the design and/or configuration of the counterflow nozzle 124f and/or the one or more purge gas ducts 126f. In this sense, the design and/or configuration of the counterflow nozzle 124f and/or the one or more purge gas ducts 126f may result in a specific protection factor of the system 100f having the counterflow nozzle 124f when in operation. In the way of an illustrative example, the protection factor of the system 100f including the counterflow nozzle 124f, and wherein the purge gas comprises argon, may be equivalent to approximately 4,600,000.

It is noted that, for purposes of the present disclosure, specific examples of protection factors of the system 100 having the various embodiments of the counterflow nozzle 124 described herein, are intended to be illustrative rather than limiting. Specifically, it is noted that the protection factor of any given embodiment of the system 100 is dependent upon a plurality of variables with respect to the system 100, including, without limitation, the diameter of the aperture 110, an area of the aperture 110, a temperature of the purge gas, a velocity of one or more particles of the purge gas, a conductance of the purge gas at the aperture 110, the location of the one or more purge gas ducts 126 within the counterflow nozzle 124, the length of the counterflow nozzle 124, or the like.

Figure 8:
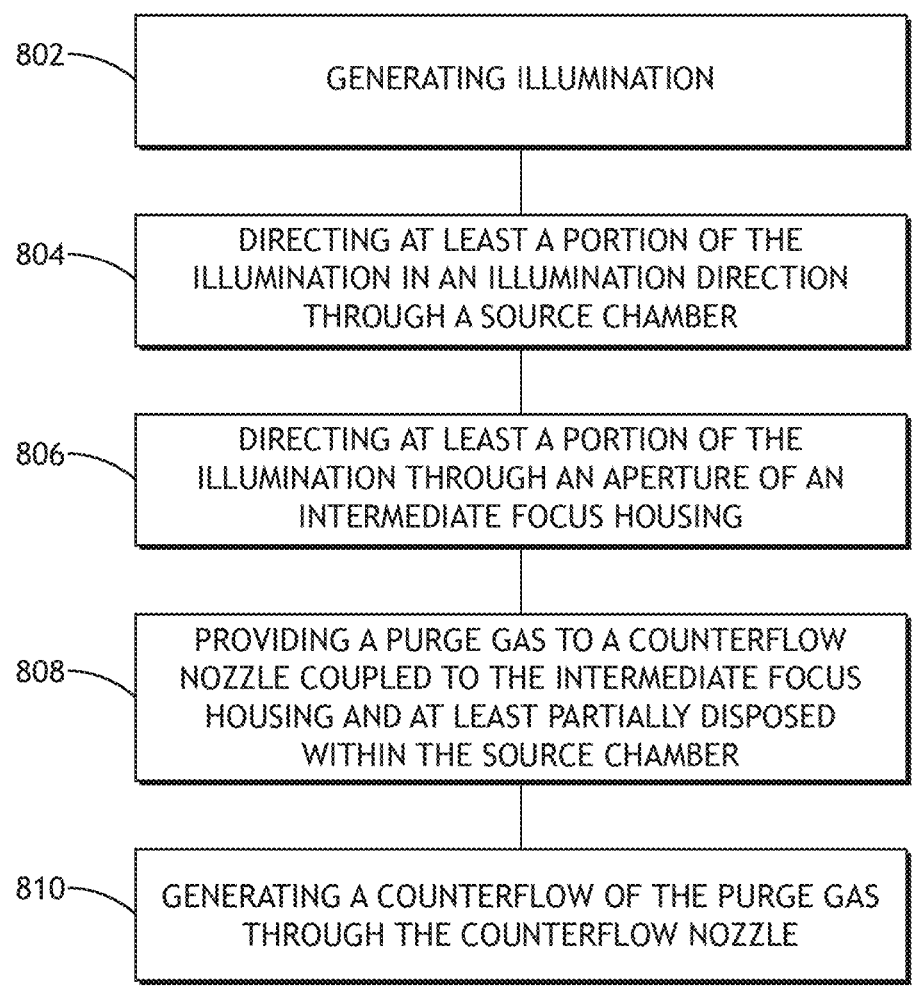
FIG. 8 depicts a process flow diagram illustrating the steps of a method of reducing contamination of an optical system, in accordance with one or more embodiments of the present disclosure.

FIG. 8 depicts a process flow diagram illustrating the steps of a method 800 of reducing contamination of an optical system, in accordance with one or more embodiments of the present disclosure.

In Step 802, illumination is generated. For example, the illumination source 112 may generate one or more beams of radiation (e.g., illumination 118).

In Step 804, at least a portion of the illumination is directed in an illumination direction through at least a portion of a source chamber. For example, in Step 804, the illumination 118 may be directed into or through one or more portions of the source chamber 102. By way of another example, the illumination may be directed to, by, or through the one or more illumination optics 105 along the illumination axis 121.

In Step 806, at least a portion of the illumination is directed in an illumination direction through an aperture of an intermediate focus housing. For example, the set of illumination optics 105 may direct the illumination 118 through the aperture 110 of the intermediate focus housing 108.

In Step 808, a purge gas is provided to a counterflow nozzle coupled to the intermediate focus housing and at least partially disposed within the source chamber. For example, the purge gas source 128 may provide the purge gas to counterflow nozzle 124 via the purge gas inlet 122, wherein the counterflow nozzle 124 is coupled to and is in fluid communication with at least a portion of the intermediate focus housing.

In Step 810, a counterflow of the purge gas through the counterflow nozzle is generated. For example, the purge gas may be provided in the flow 125 to the one or more purge gas ducts 126 and transmitted through the counterflow nozzle 124 into the source chamber 102. The flow 125 of the purge gas may be configured to prevent transmission of one or more contaminants 136 from the source chamber 102 to the one or more vacuum chambers 104 (where inspection processes may be performed). By way of another example, contaminants 136 that may be present in the source chamber 102 and that would otherwise be prone to fluid transmission to the one or more vacuum chambers 104 (e.g., such as through the aperture 110 of the intermediate focus housing 108) may be prevented from flowing to the one or more vacuum chambers 104 by the flow 125 of purge gas. In this sense, the method 800 (e.g., via at least Step 810) may be configured such that illumination 118 is directed through the aperture 110, while the transmission of contaminants 136 through the aperture 110 is mitigated.

It is noted that the scope of the present disclosure is not limited to the optical system 100. Rather, the system incorporating the various aspects of the present disclosure may include any other optical system known in the art, including a characterization system, a metrology system, and/or a lithography system.

For example, in one embodiment, the optical system 100 is configured as a wafer inspection system or a reticle inspection system. In this regard, the optical system 100 may include any wafer or reticle inspection optical architecture known in the art suitable for operating in the EUV and/or VUV spectral range. It is further recognized that the optical system 100 may be configured as an EUV mask blank inspection system. EUV-based mask blank inspection is described generally in U.S. Pat. No. 8,711,346 to Stokowski, issued on Apr. 29, 2014, which is incorporated herein by reference in the entirety. EUV-based mask blank inspection is described generally in U.S. patent application Ser. No. 13/417,982 to Xiong et al., filed on Mar. 12, 2012, which is incorporated herein by reference in the entirety. EUV-based reticle inspection is generally described in U.S. patent application Ser. No. 13/905,449 to Nasser-Ghodsi et al., filed on May 30, 2013, which is incorporated herein by reference in the entirety.

By way of another example, in another embodiment, although not shown, the optical system 100 may be configured as an EUV lithography system. In one embodiment, the optical lithography system (not shown) may include a set of illuminator optics configured to direct output light from the illumination source 112 to an EUV-compatible lithography mask (e.g., EUV reflective mask). In another embodiment, the lithography system includes a set of projection optics configured to receive illumination reflected from the mask and direct the reflected illumination from the mask to one or more wafers disposed on a wafer stage. The optical lithography system may include any EUV lithography system known in the art. EUV-based lithography is described generally in U.S. patent application Ser. No. 13/419,042 to Wang, filed on Mar. 13, 2012, which is incorporated herein by reference in the entirety.

It is contemplated herein that the various embodiments of the present disclosure may be implemented conjunctively or independently. For example, the embodiments depicted in FIG. 1A through FIG. 7C should, in some embodiments, be interpreted to be applicable in conjunction with one another.

The one or more processors 132 of a controller 140 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 132 may include any device configured to execute algorithms and/or instructions (e.g., program instructions stored in memory). In one embodiment, the one or more processors 132 may be embodied as a desktop computer, mainframe computer system, workstation, image computer, parallel processor, networked computer, or any other computer system configured to execute a program configured to operate or operate in conjunction with the optical system 100, as described throughout the present disclosure.

Moreover, different components of the system 100, including, without limitation, the illumination source 112, the detector 138, the one or more vacuum pumps 130, and/or the purge gas source 128, may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 140 or, alternatively, multiple controllers. Additionally, the controller 140 may include one or more controllers housed in a common housing or within multiple housings. In this way, any controller or combination of controllers may be separately packaged as a module suitable for integration into optical system 100. Further, the controller 140 may analyze data received from the detector 138 and feed the data to additional components within the system 100 or external to the system 100.

The memory 134 may include any storage medium known in the art suitable for storing program instructions executable by the associated one or more processors 132. For example, the memory 134 may include a non-transitory memory medium. By way of another example, the memory 134 may include, but is not limited to, a read-only memory (ROM), a random-access memory (RAM), a magnetic or optical memory device (e.g., disk), a magnetic tape, a solid-state drive and the like. It is further noted that memory 134 may be housed in a common controller housing with the one or more processors 132. In one embodiment, the memory 134 may be located remotely with respect to the physical location of the one or more processors 132 and controller 140. For instance, the one or more processors 132 of controller 140 may access a remote memory (e.g., server), accessible through a network (e.g., internet, intranet and the like).

In one embodiment, though not shown, a user interface may be communicatively coupled to the controller 140. In one embodiment, the user interface may include, but is not limited to, one or more desktops, laptops, tablets, and the like. In another embodiment, the user interface includes a display used to display data of the system 100 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

In another embodiment, the controller 140 is communicatively coupled to one or more elements of the system 100. In this regard, the controller 140 may transmit and/or receive data from any component of the system 100. Further, the controller 140 may direct or otherwise control any component of the system 100 by generating one or more control signals for the associated components. For example, the controller 140 may be communicatively coupled to at least one of the illumination source 112, detector 138, the one or more vacuum pumps 130, and/or the purge gas source 128, and may be configured to control any one or more of the illumination source 112, detector 138, the one or more vacuum pumps 130, and/or the purge gas source 128 by generating one or more control signals.

All of the methods described herein may include storing results of one or more steps of the method embodiments in memory 134. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As may be used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use herein of any plural and/or singular terms, those having skill in the art can translate from the plural to the singular and/or from the singular to the plural as is appropriate to the context and/or application. The various singular/plural permutations are not necessarily expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention disclosed and described herein is defined by the appended claims. It will be understood by those within the art that, in general, terms used herein, and especially in the appended claims (e.g., bodies of the appended claims), are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An optical system comprising:
    a source chamber;
    one or more vacuum chambers containing a set of imaging optics;
    an intermediate focus housing having an aperture, wherein the intermediate focus housing is coupled to the source chamber and the one or more vacuum chambers;
    an illumination source configured to generate illumination and direct the illumination through one or more portions of the source chamber;

a set of illumination optics configured to receive at least a portion of the illumination from the illumination source and direct at least a portion of the illumination in an illumination direction via an illumination axis to a sample, wherein the illumination axis is configured such that at least a portion of the illumination is transmitted through the aperture;

a purge gas inlet coupled to the intermediate focus housing, wherein the purge gas inlet is configured to deliver a purge gas to one or more purge gas ducts; and a counterflow nozzle coupled to the intermediate focus housing and at least partially disposed within the source chamber, wherein the counterflow nozzle is configured to receive the purge gas and direct, via the one or more purge gas ducts, a counterflow of the purge gas into the source chamber in a direction opposite the illumination direction, wherein the one or more purge gas ducts are formed within the counterflow nozzle and wherein the one or more purge gas ducts are configured to cause the counterflow of the purge gas to be laminar, the counterflow of the purge gas being configured to mitigate contamination within the one or more vacuum chambers by reducing the transmission of one or more volatile species contaminants into the one or more vacuum chambers.

2. The optical system of claim 1, wherein the set of imaging optics is configured to receive at least a portion of the illumination from the sample along an imaging axis.

3. The optical system of claim 1, further comprising a detector configured to receive at least a portion of the illumination from the sample via the set of imaging optics.

4. The optical system of claim 1, wherein the optical system is configured as a mask inspection system.

5. The optical system of claim 1, wherein the source chamber has a source chamber pressure, and wherein the one or more vacuum chambers each has a pressure less than the source chamber pressure.

6. The optical system of claim 1, wherein the illumination source is configured to generate at least one of extreme ultraviolet light, vacuum ultraviolet light, deep ultraviolet light, or ultraviolet light.

7. The optical system of claim 5, further comprising one or more vacuum pumps configured to generate a selected pressure within each of the one or more vacuum chambers.

8. The optical system of claim 7, wherein the one or more vacuum pumps comprise one or more turbomolecular pumps.

9. The optical system of claim 1, wherein the set of illumination optics is configured to direct at least a portion of the illumination through the aperture.

10. The optical system of claim 1, wherein the source chamber is filled with at least one of argon or xenon.

11. The optical system of claim 1, wherein the purge gas comprises argon.

12. The optical system of claim 1, wherein the counterflow nozzle comprises a plurality of nozzle components.

13. The optical system of claim 1, wherein the counterflow nozzle is configured to increase a protection factor of the optical system.

14. An apparatus comprising:
an intermediate focus housing, wherein the intermediate focus housing is coupled to each of a source chamber and one or more vacuum chambers, and wherein the intermediate focus housing includes an aperture;

a purge gas inlet coupled to the intermediate focus housing, wherein the purge gas inlet is configured to deliver a purge gas to one or more purge gas ducts; and a counterflow nozzle coupled to the intermediate focus housing and at least partially disposed within the source chamber, wherein the counterflow nozzle is configured to receive the purge gas and direct, via the one or more purge gas ducts, a counterflow of the purge gas into the source chamber in a direction opposite an illumination direction, wherein the one or more purge gas ducts are formed within the counterflow nozzle and wherein the one or more purge gas ducts are configured to cause the counterflow of the purge gas to be laminar, the counterflow of the purge gas being configured to mitigate contamination within the one or more vacuum chambers by reducing the transmission of one or more volatile species contaminants into the one or more vacuum chambers.

15. A method of reducing optical system contamination comprising:
generating illumination and directing at least a portion of the illumination in an illumination direction to one or more portions of a source chamber;

directing at least a portion of the illumination through an aperture of an intermediate focus housing, wherein the intermediate focus housing is disposed between the source chamber and one or more vacuum chambers;

providing a purge gas to a counterflow nozzle coupled to the intermediate focus housing and at least partially disposed within the source chamber; and generating a laminar counterflow of the purge gas through the counterflow nozzle in a direction opposite the illumination direction.

16. The method of claim 15, wherein the generating a counterflow of the purge gas comprises reducing the transmission of one or more volatile species contaminants into the one or more vacuum chambers.

17. The method of claim 15, wherein the illumination comprises at least one of extreme ultraviolet light, vacuum ultraviolet light, deep ultraviolet light, or ultraviolet light.

18. The method of claim 15, wherein the providing the purge gas to the counterflow nozzle coupled to the intermediate focus housing and at least partially disposed within the source chamber comprises providing the purge gas to the intermediate focus housing via a purge gas inlet, and further comprises providing the purge gas to one or more purge gas ducts of the intermediate focus housing.

19. The method of claim 15, wherein the purge gas comprises argon.

20. The method of claim 15, wherein one or more purge gas ducts are configured to generate the laminar counterflow of the purge gas flow.

* * * * *